(12) United States Patent
Ogasawara et al.

(10) Patent No.: US 12,218,531 B2
(45) Date of Patent: Feb. 4, 2025

(54) CHARGE CONTROL DEVICE AND CHARGE CONTROL METHOD

(71) Applicant: HONDA MOTOR CO., LTD., Tokyo (JP)

(72) Inventors: Kota Ogasawara, Tokyo (JP); Akira Saita, Tokyo (JP); Toru Ogaki, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 500 days.

(21) Appl. No.: 17/679,527

(22) Filed: Feb. 24, 2022

(65) Prior Publication Data
US 2022/0320875 A1 Oct. 6, 2022

(30) Foreign Application Priority Data

Mar. 31, 2021 (JP) .................................. 2021-059105

(51) Int. Cl.
H02J 7/00 (2006.01)
G01R 31/374 (2019.01)
G01R 31/3842 (2019.01)

(52) U.S. Cl.
CPC ........ H02J 7/00036 (2020.01); G01R 31/374 (2019.01); G01R 31/3842 (2019.01); H02J 7/0049 (2020.01); H02J 7/0063 (2013.01)

(58) Field of Classification Search
USPC ....................................................... 320/152
See application file for complete search history.

(56) References Cited

U.S. PATENT DOCUMENTS

2015/0229151 A1* 8/2015 Sudan ............... H02J 7/007194
320/137
2015/0249355 A1 9/2015 Takano et al.
2015/0258909 A1* 9/2015 Kim ................... B60H 1/00392
320/155
(Continued)

FOREIGN PATENT DOCUMENTS

JP 2016220498 A 12/2016
WO 2014046233 A1 3/2014

OTHER PUBLICATIONS

Notice of Reasons for Refusal for Patent Application JP 2021-059105 dated Jul. 12, 2022; 5 pp.

Primary Examiner — Samuel Berhanu
(74) Attorney, Agent, or Firm — Armstrong Teasdale LLP

(57) ABSTRACT

A charge control device for charging a battery with electric power supplied from an external power supply includes: an external power supply information acquisition unit that acquires external power supply information including a voltage of the external power supply; a battery information acquisition unit that acquires battery information including a temperature, a voltage, and an electric current of the battery; a power consumption acquisition unit that acquires an amount of electric power supplied from the battery to an auxiliary device as a power consumption amount; and a charge time estimation unit that estimates a charge time of the battery. The charge time estimation unit acquires an initial value of a state of charge of the battery based on the battery information, and estimates the charge time based on the battery temperature, the external power supply information, the power consumption amount, and the initial value of the state of charge.

5 Claims, 5 Drawing Sheets

(56) References Cited

U.S. PATENT DOCUMENTS

2016/0347302 A1     12/2016  Niwa et al.
2017/0200994 A1      7/2017  Kim et al.
2021/0300197 A1*     9/2021  Yi ........................... B60L 58/26

* cited by examiner battery temperature estimation process

CHARGE CONTROL DEVICE AND CHARGE CONTROL METHOD

TECHNICAL FIELD

The present invention relates to a charge control device and a charge control method.

BACKGROUND ART

WO2014/046233A1 discloses a charge control device for a vehicle that acquires a charge time by referring to multiple maps based on a charging electric power, a battery temperature, and a state of charge (SOC), and displays the charge time on a display device.

However, even during charging, one or more auxiliary devices such as a temperature adjustment device may be driven so that the electric power of the battery is consumed. In this case, there is a problem that the actual charge time becomes longer than the charge time displayed on the display device. To solve this problem, it may be conceived to prepare a map beforehand taking into account the power consumption by the auxiliary devices, but it requires to take into account various use states of the multiple auxiliary devices, and this creates a problem that the map becomes complicated and the amount of data increases.

SUMMARY OF THE INVENTION

In view of the foregoing background, a primary object of the present invention is to provide a charge control device and a charge control method which can estimate the charge time accurately.

To achieve the above object, one aspect of the present invention provides a charge control device (1) for charging a battery (3) with electric power supplied from an external power supply (16), the charge control device comprising: an external power supply information acquisition unit (24, 25) that acquires external power supply information including a voltage of the external power supply; a battery information acquisition unit (21, 22, 23) that acquires battery information including a temperature, a voltage, and an electric current of the battery; a power consumption acquisition unit (27) that acquires an amount of electric power supplied from the battery to an auxiliary device (12) as a power consumption amount; and a charge time estimation unit (33) that estimates a charge time of the battery, wherein the charge time estimation unit acquires an initial value of a state of charge of the battery based on the battery information, and estimates the charge time based on the temperature of the battery, the external power supply information, the power consumption amount, and the initial value of the state of charge.

According to this aspect, since the charge time is estimated by taking into account the temperature and the electric power consumption of the battery, the charge time can be estimated accurately.

In the above aspect, preferably, the charge time estimation unit calculates a current value of the state of charge by adding, to a previous value of the state of charge, an integrated value of a current value of the electric current of the battery calculated based on the temperature of the battery, the external power supply information, and the power consumption amount, and sets a time required for the current value of the state of charge to become a charge completion value or greater as the charge time.

According to this aspect, since the state of charge at each time point is acquired by taking into account the battery temperature at each time point, the charge time can be estimated accurately.

In the above aspect, preferably, the charge time estimation unit acquires a current value of the temperature of the battery based on a previous value of the temperature of the battery, a temperature of a coolant that cools the battery, and an outside temperature.

According to this aspect, the battery temperature at each time point can be estimated accurately. As a result, the state of charge at each time point can be estimated accurately and the charge time can be estimated accurately.

In the above aspect, preferably, the charge time estimation unit calculates a current value of electric power of the battery by multiplying a previous value of the voltage of the battery by a previous value of the electric current of the battery, acquires a current value of the voltage of the battery based on the current value of the electric power of the battery and a current value of the temperature of the battery, calculates a current value of a rate-determining charge electric current by dividing the electric power of the external power supply by the current value of the voltage of the battery, acquires a current value of a limit electric current which is an electric current value below which the battery can be protected based on a cell voltage of the battery and the current value of the temperature of the battery, and acquires the current value of the electric current of the battery by subtracting a consumption electric current value acquired from a power consumption amount from a smaller one of the current value of the rate-determining charge electric current and the current value of the limit electric current.

According to this aspect, the state of charge at each time point can be estimated accurately.

Another aspect of the present invention provides a charge control method for charging a battery (3) with electric power supplied from an external power supply (18), the method comprising: acquiring external power supply information including a voltage of the external power supply; acquiring battery information including a temperature, a voltage, and an electric current of the battery; acquiring an amount of electric power supplied from the battery to an auxiliary device (12) as a power consumption amount; acquiring an initial value of a state of charge of the battery based on the battery information; and estimating a charge time based on the temperature of the battery, the external power supply information, the power consumption amount, and the initial value of the state of charge.

According to this aspect, since the charge time is estimated by taking into account the temperature and the electric power consumption of the battery, the charge time can be estimated accurately. In addition, even when there are various auxiliary devices, the electric power consumption of each individual auxiliary device is not taken into account but instead, the electric power consumption of the all auxiliary devices is taken into account, and therefore, the calculation can be made easily.

According to the foregoing configuration, it is possible to provide a charge control device and a charge control method which can estimate the charge time accurately.

DETAILED DESCRIPTION OF THE INVENTION

In the following, an embodiment of a charge control device 1 according to the present invention will be described. The charge control device 1 controls charging of the battery 3 installed in a vehicle 2 such as an electric car or a plug-in hybrid vehicle.

Figure 1:
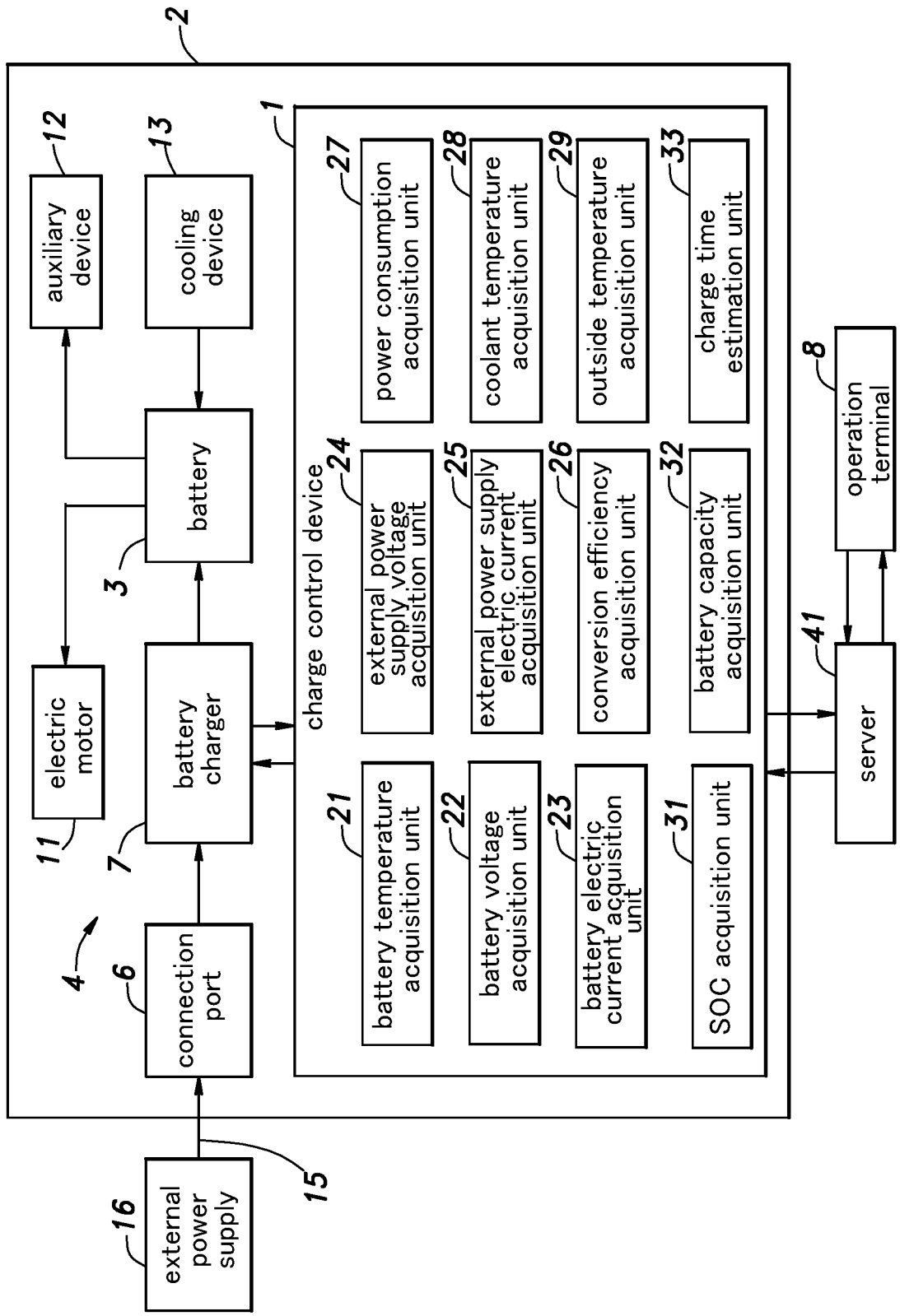
FIG. 1 is a configuration diagram of a charge control device according to an embodiment of the present invention.

As shown in FIG. 1, a battery system 4 includes a battery 3, a connection port 6, a battery charger 7, and an operation terminal 8, in addition to the charge control device 1. The battery 3 includes multiple cells such as lithium ion battery cells. The multiple cells are connected in series or in parallel with each other. The battery 3 supplies electric power to an electric motor 11, which is a drive source of the vehicle 2, and to various auxiliary devices 12. Also, the battery 3 is charged by receiving regenerative electric power from the electric motor 11 and electric power from an external power supply 16.

The battery 3 is provided with a cooling device 13. The cooling device 13 has a coolant circulation flow path through which a coolant (for example, water) is circulated, a cooler (such as a radiator) that cools the coolant, and a coolant pump that circulates the coolant. The circulation flow path is arranged such that the coolant flowing therethrough can exchange heat with the battery 3. The battery 3 is cooled by exchanging heat with the coolant.

The auxiliary devices 12 are driven by the electric power supplied from the battery 3. The auxiliary devices 12 include, for example, an air conditioner, a pump that circulates the coolant of the electric motor 11, a pump that circulates the coolant of the cooling device 13, a heater for heating the battery 3, etc.

The connection port 6 is provided in the vehicle 2 and can be connected with the external power supply 16 via a charging cable 15. The external power supply 16 is an AC power supply. The battery charger 7 is a so-called onboard charger installed in the vehicle 2. The battery charger 7 is an electric circuit that converts the electric power supplied from the AC power supply to electric power suitable for charging of the battery 3 and supplies the converted electric power to the battery 3. The battery charger 7 includes an AC/DC converter, a DC/DC converter, a controller, and so on. The battery charger 7 is connected to the connection port 6 and the battery 3.

The charge control device 1 includes a battery temperature acquisition unit 21, a battery voltage acquisition unit 22, a battery electric current acquisition unit 23, an external power supply voltage acquisition unit 24, an external power supply electric current acquisition unit 25, a conversion efficiency acquisition unit 26, a power consumption acquisition unit 27, a coolant temperature acquisition unit 28, an outside temperature acquisition unit 29, an SOC acquisition unit 31, a battery capacity acquisition unit 32, and a charge time estimation unit 33. The charge control device 1 is preferably configured by an electronic control unit (ECU) and multiple sensors connected to the ECU, where the ECU typically includes a CPU, a non-volatile memory (ROM), a volatile memory (RAM), and so on.

The battery temperature acquisition unit 21 is a sensor provided in the battery 3 to acquire the temperature of the battery 3. The battery voltage acquisition unit 22 is a sensor provided in the battery 3 to acquire the voltage of the battery 3. The battery voltage acquisition unit 22 acquires the voltage of each of the multiple cells included in the battery 3 (the voltage of each cell will be referred to as a cell voltage) and a total voltage of the battery 3, which is the voltage of the whole unit configured by the multiple cells (hereinafter, the total voltage will be referred to as a battery voltage). The battery electric current acquisition unit 23 is a sensor provided in the battery 3 to acquire the electric current of the battery 3. The battery temperature acquisition unit 21, the battery voltage acquisition unit 22, and the battery electric current acquisition unit 23 constitute a battery information acquisition unit. The battery temperature, the battery voltage, and the battery electric current may be referred to as battery information.

The external power supply voltage acquisition unit 24 is provided in the battery charger 7 to acquire the voltage of the external power supply 16. The external power supply electric current acquisition unit 25 is provided in the battery charger 7 to acquire the electric current of the external power supply 16. Preferably, the external power supply electric current acquisition unit 25 acquires the maximum electric current of the external power supply 16. The conversion efficiency acquisition unit 26 acquires the conversion efficiency of the battery charger 7. The conversion efficiency is a ratio of the electric power supplied from the battery charger 7 to the battery 3 to the electric power input from the external power supply 16 to the battery charger 7. For example, the conversion efficiency acquisition unit 26 may set a predetermined value as the conversion efficiency or may set the conversion efficiency by referring to a map based on at least one of the voltage and electric current of the external power supply 16. The external power supply electric current acquisition unit 25, the external power supply voltage acquisition unit 24, and the conversion efficiency acquisition unit 26 constitute an external power supply information acquisition unit. The external power supply electric current, the external power supply voltage, and the conversion efficiency may be referred to as external power supply information.

The power consumption acquisition unit 27 acquires an amount of electric power supplied from the battery 3 to the auxiliary devices 12 as a power consumption amount. Preferably, the power consumption acquisition unit 27 includes an electric current sensor that detects an electric current flowing in an electric cable connecting between the battery 3 and each auxiliary device 12 as a consumption electric current.

The coolant temperature acquisition unit 28 is a temperature sensor provided in the coolant circulation flow path of the cooling device 13 to detect the temperature of the coolant flowing in the coolant circulation passage. The outside temperature acquisition unit 29 is a temperature sensor that is provided on the vehicle 2 to acquire the outside temperature.

The SOC acquisition unit 31 acquires a state of charge (SOC) (charge rate [%]). The SOC acquisition unit 31 may acquire the SOC by using any known method. For example, the SOC acquisition unit 31 uses a map defining a relationship between the voltage and the SOC of the battery 3 to acquire the SOC based on the voltage of the battery 3. Preferably, the map is updated depending on a deterioration degree of the battery 3. The deterioration degree of the battery 3 may be preferably acquired based on the internal resistance of the battery 3, for example. In another method, the SOC acquisition unit 31 may acquire the SOC by integrating the electric current of the battery 3.

The battery capacity acquisition unit 32 acquires a battery capacity, namely, a full charge capacity of the battery 3. The battery capacity acquisition unit 32 may acquire the battery capacity by using any known method. For example, the battery capacity acquisition unit 32 may acquire the battery capacity by multiplying the initial value of the battery capacity set beforehand by the deterioration degree.

The charge time estimation unit 33 estimates a charge time of the battery 3 (a time duration required for charging the battery 3). The charge time may be converted to a charge completion time (a time point at which the charge will be completed) based on the current time. The charge time estimation unit 33 acquires the charge time by executing a later-described charge time estimation process.

The charge control device 1 is connected with the operation terminal 8 in a communicable manner. The operation terminal 8 has an interface that allows input and output. The interface preferably is a touch panel display, for example. The operation terminal 8 may be installed in the vehicle 2 and be connected with the charge control device 1 via a cable. Also, the operation terminal 8 may be a mobile terminal such as a smartphone which wirelessly communicates with the charge control device 1. Also, the operation terminal 8 may wirelessly communicate with the charge control device 1 via a server 41.

The operation terminal 8 acquires a charge completion SOC (charge completion value) according to an input operation of the user. Also, the operation terminal 8 outputs a charge start command to the charge control device 1 according to an input operation of the user. When the battery charger 7 is connected to the external power supply 16 via a cable and the charge start command is received from the operation terminal 8, the charge control device 1 starts charging of the battery 3.

The charge control device 1 outputs information on the charge time or the charge completion time that was estimated to the operation terminal 8, and the operation terminal 8 displays the charge time or the charge completion time on the interface.

Figure 2:
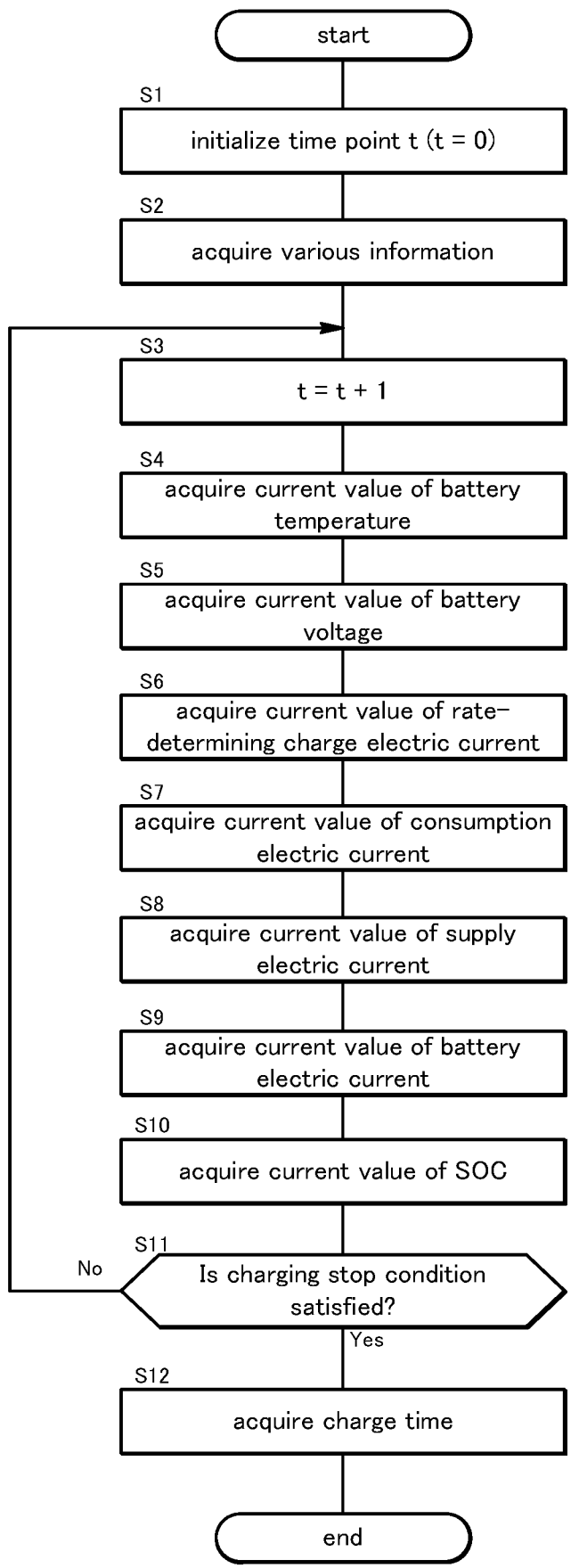
FIG. 2 is a flowchart of a charge control method executed by the charge control device.

The charge time estimation unit 33 executes the charge time estimation process according to the flowchart shown in FIG. 2. The charge time estimation unit 33 executes the charge time estimation process at the start of charging. Also, the charge time estimation unit 33 may execute the charge time estimation process at a predetermined time interval during charging of the battery 3 to update the charge time.

The charge time estimation unit 33 first sets 0 to time point t to initialize the time parameter (S1).

Next, the charge time estimation unit 33 acquire various information when time point t=0 (S2). The charge time estimation unit 33 acquires values when time point t=0 (namely, initial values) of the battery temperature, the coolant temperature, the outside temperature, the SOC, the maximum electric current of the external power supply 16, the battery capacity of the battery 3, the conversion efficiency, and the charge completion SOC. As described above, the battery temperature is acquired by the battery temperature acquisition unit 21. The coolant temperature is acquired by the coolant temperature acquisition unit 28. The outside temperature is acquired by the outside temperature acquisition unit 29. The SOC is acquired by the SOC acquisition unit 31. The maximum electric current of the external power supply 16 is acquired by the external power supply electric current acquisition unit 25. The battery capacity of the battery 3 is acquired by the battery capacity acquisition unit 32. The conversion efficiency is acquired by the conversion efficiency acquisition unit 26. The charge completion SOC is acquired by the operation terminal 8.

Next, the charge time estimation unit 33 adds +1 to time point t to advance time point t (S3). The increase of time point t by 1 corresponds to elapsing of a predetermined sampling time. The sampling time may be preferably set to 1 [s], for example. In the following description, a value at time point t will be referred to as a current value and a value at time point t−1, which is prior to time point t by one sampling time, will be referred to as a previous value.

Figure 3:
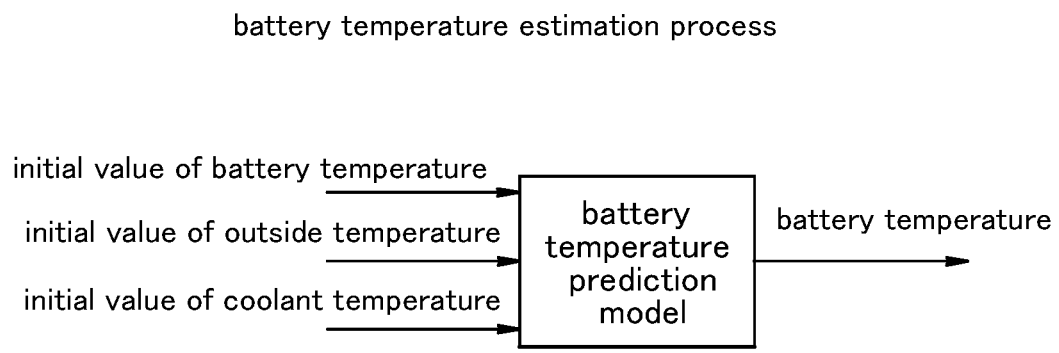
FIG. 3 is an explanatory diagram showing the procedure of a battery temperature estimation process.

Next, the charge time estimation unit 33 estimates the battery temperature at time point t, namely, the current value of the battery temperature (S4). The charge time estimation unit 33 estimates the battery temperature at time point t according to a battery temperature estimation process shown in FIG. 3. For example, the charge time estimation unit 33 estimates the battery temperature at time point t based on a battery temperature prediction model set beforehand. In the present embodiment, the battery temperature at each time point may be estimated by inputting the initial value of the battery temperature, the initial value of the coolant temperature, and the initial value of the outside temperature into the battery temperature prediction model.

Figure 4:
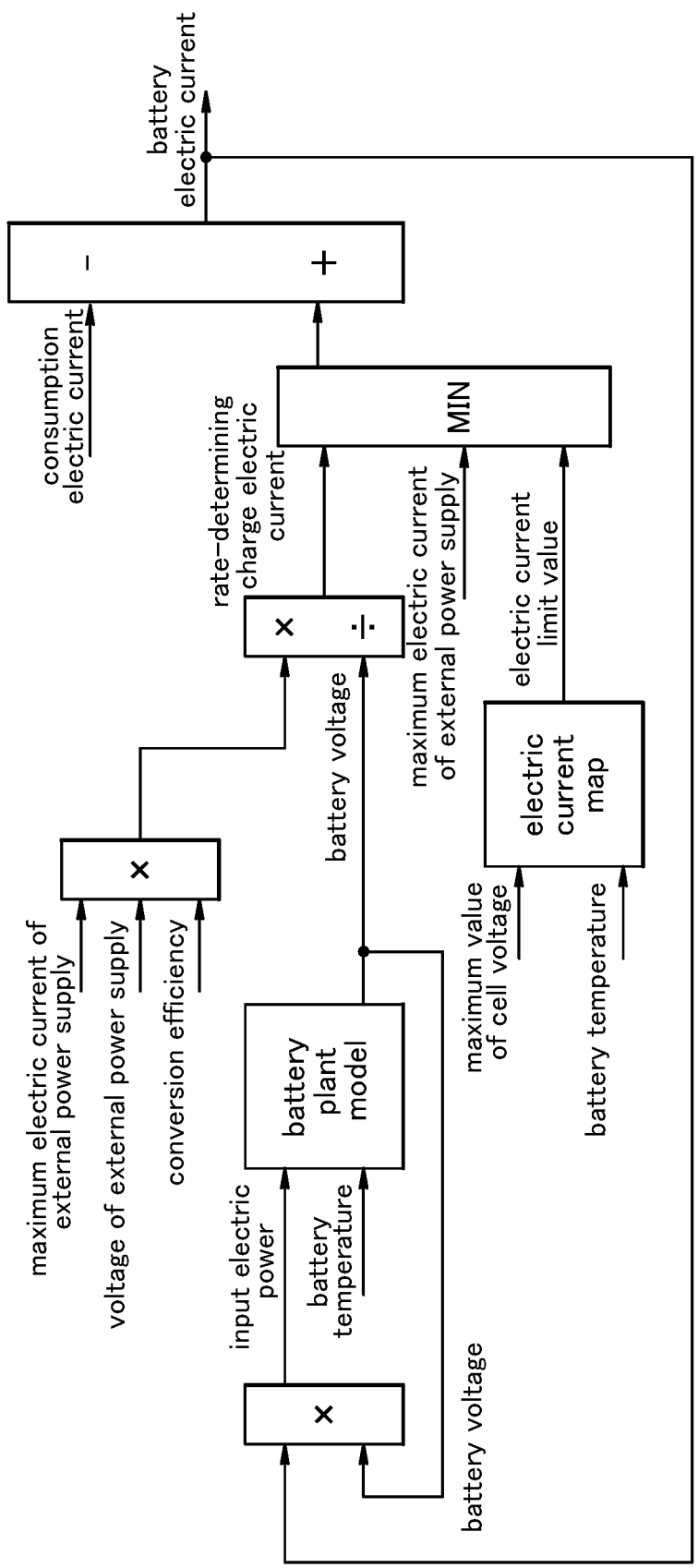
FIG. 4 is an explanatory diagram showing the procedure of a battery electric current estimation process.

As shown in FIG. 2, the charge time estimation unit 33 subsequently estimates the battery voltage at time point t, namely, the current value of the battery voltage (S5). As shown in FIG. 4, the charge time estimation unit 33 estimates the battery voltage as a part of a battery electric current estimation process for estimating the battery electric current at time point t. The charge time estimation unit 33 calculates input electric power, which is the electric power input to the battery 3, by multiplying the previous value of the battery electric current by the previous value of the battery voltage, and estimates the current value of the battery voltage by inputting the calculated input electric power and the current value of the battery temperature into a battery plant model created beforehand. In the creation of the battery plant model, the battery capacity, an SOC-OCV curve identified beforehand, the battery's internal resistance, etc. may be used in addition to the current value of the electric power of the battery and the previous value of the voltage of the battery.

As shown in FIG. 2, the charge time estimation unit 33 then acquires a rate-determining charge electric current at time point t, namely, the current value of the rate-determining charge electric current (S6). As shown in FIG. 4, the charge time estimation unit 33 estimates the rate-determining charge electric current as a part of the battery electric current estimation process. The charge time estimation unit 33 acquires electric power of the external power supply 16 as a product of the initial value of the maximum electric current of the external power supply 16, the initial value of the voltage of the external power supply 16, and the initial value of the conversion efficiency. Then, the charge time estimation unit 33 acquires the rate-determining charge electric current by dividing the electric power of the external power supply 16 by the current value of the battery voltage.

As shown in FIG. 2, the charge time estimation unit 33 then acquires the value of the consumption electric current of the all auxiliary devices 12 at time point t (S7).

Next, the charge time estimation unit 33 acquires a supply electric current at time point t, namely, the current value of the supply electric current (S8). The supply electric current is the electric current supplied from the external power supply 16 to the battery 3. As shown in FIG. 4, the charge time estimation unit 33 estimates the supply electric current as a part of the battery electric current estimation process. The charge time estimation unit 33 refers to an electric current map set beforehand based on a predetermined maximum value of the cell voltage and the current value of the battery temperature to acquire a current value of an electric current limit value. The electric current map defines a relationship between the maximum value of the cell voltage, the battery temperature, and the electric current limit value. The electric current limit value is an electric current value set to protect the battery 3 when charged. Protection of the battery 3 includes suppressing deterioration due to a rise of the temperature of the battery or the like, electrodeposition in the battery, or any other deterioration factors. The charge time estimation unit 33 compares the current value of the rate-determining charge electric current, the initial value of the maximum electric current of the external power supply 16, and the current value of the limit electric current, and sets the minimum of them as the current value of the supply electric current.

As shown in FIG. 2, the charge time estimation unit 33 then acquires the battery electric current at time point t, namely, the current value of the battery electric current (S9). As shown in FIG. 4, the charge time estimation unit 33 acquires the battery electric current as a part of the battery electric current estimation process. The charge time estimation unit 33 acquires the current value of the battery electric current by subtracting the consumption electric current value from the current value of the supply electric current.

Figure 5:
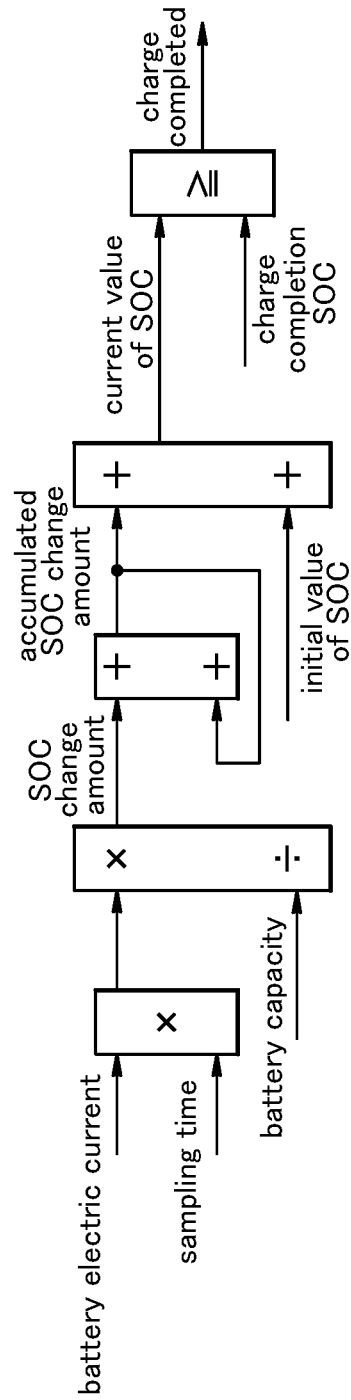
FIG. 5 is an explanatory diagram showing the procedure of a charging stop determination process.

As shown in FIG. 2, the charge time estimation unit 33 then acquires the SOC at time point t, namely, the current value of the SOC (S10). As shown in FIG. 5, the charge time estimation unit 33 acquires the current value of the SOC as a part of a charging stop determination process. The charge time estimation unit 33 multiplies the current value of the battery electric current by the sampling time, thereby to acquire an amount of electric charge supplied to the battery 3 in the sampling time. The amount of electric charge supplied to the battery 3 in the sampling time corresponds to an integrated value obtained by integrating the current value of the battery electric current with the sampling time. Then, the charge time estimation unit 33 divides the amount of electric charge supplied to the battery 3 in the sampling time by the battery capacity to acquire the current value of an amount of change of the SOC in the sampling time. Then, the charge time estimation unit 33 adds the current value of the amount of change of the SOC in the sampling time to an accumulated SOC change amount, which is the total of the amount of change of the SOC in each sampling time up to the previous calculation, thereby to acquire the amount of change of the SOC from the start of charge to time point t, namely, the current value of the accumulated SOC change amount. Then, the charge time estimation unit 33 adds the amount of change of the SOC from the start of charge to time point t (the accumulated SOC change amount) to the initial value of the SOC to acquire the current value of the SOC. In another embodiment, the charge time estimation unit 33 may acquire the current value of the SOC by adding the current value of the amount of change of the SOC in the sampling time to the previous value of the SOC.

As shown in FIG. 2, the charge time estimation unit 33 then determines whether a charging stop condition is satisfied (S11). As shown in FIG. 5, the charge time estimation unit 33 determines that the charging stop condition is met when the current value of the SOC is greater than or equal to the charge completion SOC.

When the current value of the SOC is less than the charge completion SOC and hence the charging stop condition is not satisfied (determination result of S11 is No), the charge time estimation unit 33 repeats the process from step S3 to step S11. When the charging stop condition is satisfied (determination result of S11 is Yes), the charge time estimation unit 33 converts time point t to time based on the sampling time, thereby to acquire the charge time (S12).

According to the charge control device 1 and the charge control method of the above-described embodiment, since the charge time is estimated by taking into account the battery temperature and the electric power consumption, the charge time can be estimated accurately. Because the charge control device 1 acquires the state of charge at each time point by taking into account the battery temperature at each time point, the charge time can be estimated accurately. Also, for example even if the amount of electric power (electric current) supplied from the external power supply changes during charging, the charge time can be estimated accurately by taking into account such a change. Note that in another embodiment, it is possible to acquire an elapsed time from the start of charge or the cell voltage or electric current of the battery as a charging completion condition alternative to the charge completion SOC, and to perform determination on the charging completion based thereon.

Concrete embodiments of the present invention have been described in the foregoing, but the present invention is not limited to the above embodiments and may be modified or altered in various ways.

The invention claimed is:

1. A charge control device for charging a battery with electric power supplied from an external power supply, the charge control device comprising:
   an external power supply information acquisition unit that acquires external power supply information including a voltage of the external power supply;
   a battery information acquisition unit that acquires battery information including a temperature, a voltage, and an electric current of the battery;
   a power consumption acquisition unit that acquires an amount of electric power supplied from the battery to an auxiliary device as a power consumption amount; and
   a charge time estimation unit that estimates a charge time of the battery,
   wherein the charge time estimation unit
   acquires an initial value of a state of charge of the battery based on the battery information,
   calculates a current value of the state of charge based on a previous value of the state of charge, the temperature of the battery, the external power supply information, the power consumption amount, and
   sets a time required for the current value of the state of charge to become a charge completion value or greater as the charge time.

2. The charge control device according to claim 1, wherein the charge time estimation unit
   calculates the current value of the state of charge by adding, to the previous value of the state of charge, an integrated value of a current value of the electric current of the battery calculated based on the temperature of the battery, the external power supply information, and the power consumption amount.

3. The charge control device according to claim 2, wherein the charge time estimation unit acquires a current value of the temperature of the battery based on a previous value of the temperature of the battery, a temperature of a coolant that cools the battery, and an outside temperature.

4. The charge control device according to claim 2, wherein the charge time estimation unit
- calculates a current value of electric power of the battery by multiplying a previous value of the voltage of the battery by a previous value of the electric current of the battery,
- acquires a current value of the voltage of the battery based on the current value of the electric power of the battery and a current value of the temperature of the battery,
- calculates a current value of a rate-determining charge electric current by dividing the electric power of the external power supply by the current value of the voltage of the battery,
- acquires a current value of a limit electric current which is an electric current value below which the battery can be protected based on a cell voltage of the battery and the current value of the temperature of the battery, and
- acquires the current value of the electric current of the battery by subtracting a consumption electric current value acquired from a power consumption amount from a smaller one of the current value of the rate-determining charge electric current and the current value of the limit electric current.

5. A charge control method for charging a battery with electric power supplied from an external power supply, the method comprising:
- acquiring external power supply information including a voltage of the external power supply;
- acquiring battery information including a temperature, a voltage, and an electric current of the battery;
- acquiring an amount of electric power supplied from the battery to an auxiliary device as a power consumption amount;
- acquiring an initial value of a state of charge of the battery based on the battery information; and
- calculating a current value of the state of charge based on a previous value of the state of charge, the temperature of the battery, the external power supply information, the power consumption amount,
- setting a time required for the current value of the state of charge to become a charge completion value or greater as the charge time.

\* \* \* \* \*